(12) United States Patent
Chu et al.

(10) Patent No.: US 7,030,460 B2
(45) Date of Patent: Apr. 18, 2006

(54) SELECTABLE CAPACITANCE APPARATUS AND METHODS

(75) Inventors: Peir Chu, Portland, OR (US); Steve Schiveley, Forest Grove, OR (US); Aaron J. Steyskal, Portland, OR (US); Mike Greenwood, Oregon City, OR (US); Tao Liu, University Place, WA (US)

(73) Assignee: Intel Corporation, Santa Clara, CA (US)

( * ) Notice: Subject to any disclaimer, the term of this patent is extended or adjusted under 35 U.S.C. 154(b) by 497 days.

(21) Appl. No.: 10/193,779

(22) Filed: Jul. 11, 2002

(65) Prior Publication Data

US 2004/0007759 A1 Jan. 15, 2004

(51) Int. Cl.
*H01L 29/00* (2006.01)

(52) U.S. Cl. ...................................... 257/532; 257/535

(58) Field of Classification Search ................ 257/532, 257/534, 535
See application file for complete search history.

(56) References Cited

U.S. PATENT DOCUMENTS 6,084,285 A * 7/2000 Shahani et al. ............. 257/532

OTHER PUBLICATIONS

Samavati et al., Fractal Capacitors, Dec. 1998, IEEE Journal of Solid-state Circuits, V 12, pp 2035-2041.*

* cited by examiner

*Primary Examiner*—Hoai Pham
(74) *Attorney, Agent, or Firm*—Schwegman, Lundberg, Woessner & Kluth, P.A.

(57) ABSTRACT

A user-selectable integrated circuit capacitance apparatus may include first and second electrodes defining a first fractal geometry, along with second and third electrodes defining a second fractal geometry. A dielectric may be located adjacent to the first and third electrodes. A method of fabricating the apparatus may include selecting a dielectric layer, forming the first and second electrodes so as to define the first fractal geometry on the dielectric layer, and then forming third and fourth electrodes so as to define a second fractal geometry on the dielectric layer. A circuit package may include external package connections connected to the electrodes of the apparatus. A system may include the apparatus coupled to a wireless transceiver by way of a power supply trace.

18 Claims, 4 Drawing Sheets

SELECTABLE CAPACITANCE APPARATUS AND METHODS

TECHNICAL FIELD

Embodiments of the invention relate generally to apparatus and methods used to add capacitive elements to circuitry. More particularly, embodiments of the invention relate to capacitive elements as individual components, and as elements of other circuits, including power supply and energy storage circuits.

BACKGROUND INFORMATION

As integrated circuit (IC) technology continues to advance, and operational clocking speeds increase, circuits require more power more quickly. The traditional concept behind using capacitors to decouple ICs is to give each IC a localized reservoir of high-frequency energy. In essence, local capacitors help to "decouple" associated ICs from the main power supply, decreasing the magnitude of high frequency ripple or sag that appears on the main power bus. One or more bulk decoupling capacitors on a circuit board, in turn, typically operate to replenish each of the local capacitors.

Often circuit designers seek to use a specific amount of capacitance for a circuit, but only certain standard values are available. Using a fixed number of selected values to satisfy this need often results in over-design. In addition, the use of several different capacitors throughout a particular design to meet various needs can increase the overall circuit cost. A further difficulty is the amount of real estate required to support the use of multiple capacitors.

Capacitors are also not ideal circuit elements. In fact, a capacitor is typically modeled as a series circuit, with a total series impedance of $C_{CAP} + ESR_{CAP} + L_{CAP}$, corresponding to the sum of the capacitive, resistive, and inductive components which make up a real-world capacitor, respectively. Some available fabrication methods allow control over the specific capacitance value, and even the equivalent series resistance. This is useful when many thousands of capacitors are made on an assembly line, but not for individual circuits, which may require fine-tuning of the individual capacitance and series resistance values to ensure optimal performance.

When a capacitor is placed on a circuit board, the inductance of the traces and other connecting circuitry between the capacitor and the associated chip may further affect circuit performance at high clock speeds. The capacitor and connecting circuitry (traces) that lead to it can form a current loop that operates as an antenna, transmitting radio frequency interference generated by fast transients. Thus, bypass capacitors can do their job most efficiently when mounted in close proximity to the associated IC pins that draw such transient currents.

In addition to low series inductance in a capacitor, it's usually desirable to have a low effective series resistance, which goes hand-in-hand with a low dissipation factor. However, sometimes a very low series resistance can provoke unexpected problems in the form of resonance, especially when the value of an associated motherboard series resistance is not matched to the sum of capacitor series resistance and the resistance of traces forming interconnecting circuitry. When repetitive pulses excite the resonator formed by a low equivalent series resistance capacitor and the associated motherboard, high-amplitude ringing can result, producing an exceedingly noisy supply bus. The typical solution is to place electrolytic capacitors across the bus to damp the ringing, which is costly and uses a large amount of circuit board real estate. A better solution would be to somehow increase the series resistance of the bypass capacitor, without adding additional capacitance or inductance.

DETAILED DESCRIPTION OF EMBODIMENTS OF THE INVENTION

Figure 1:
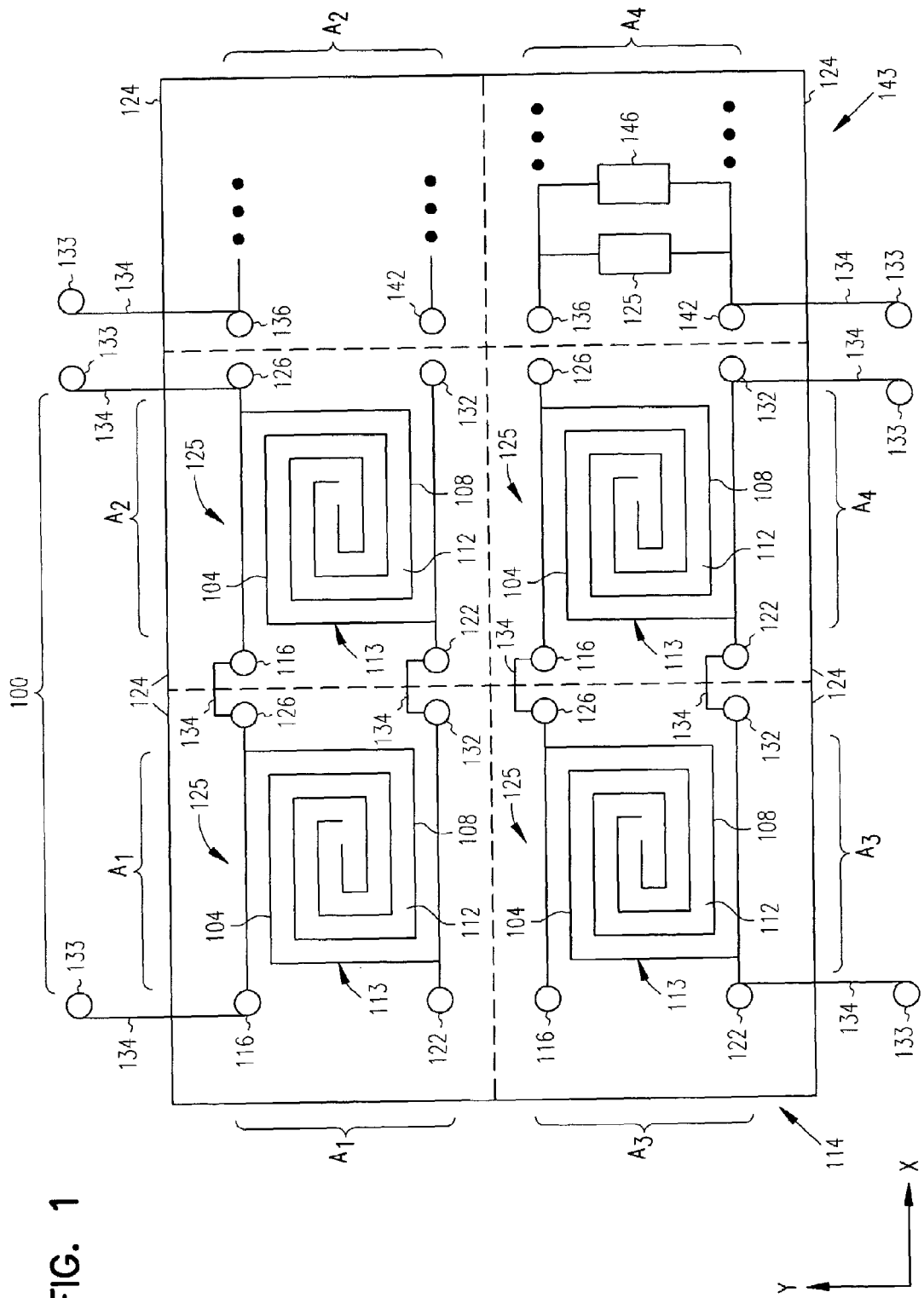
FIGS. 1 and 2 are top plan and side cut-away views, respectively, of an apparatus and circuit package according to various embodiments of the invention.

In the following detailed description of embodiments of the invention, reference is made to the accompanying drawings which form a part hereof, and in which are shown by way of illustration, and not of limitation, specific embodiments in which the invention may be practiced. In the drawings, like numerals describe substantially similar components throughout the several views. The embodiments illustrated are described in sufficient detail to enable those skilled in the art to understand and implement them. Other embodiments may be utilized and derived therefrom, such that structural and logical substitutions and changes may be made without departing from the scope of the present disclosure. The following detailed description, therefore, is not to be taken in a limiting sense, and the scope of various embodiments of the invention is defined only by the appended claims, along with the full range of equivalents to which such claims are entitled.

Embodiments of the invention described herein may be used to provide an apparatus (e.g., a single-chip capacitor) that has a user-selectable capacitance component, variable over a wide range. In addition, such an apparatus may also be constructed so as to permit selection of an equivalent series resistance. Embodiments of the invention are based on the use of a fractal geometry electrode design which can achieve high capacitance density using silicon technology. Fractal geometry electrodes also permit the design capacitance to scale with the technology feature size, providing a large amount of capacitance at a relatively low cost.

Figure 2:
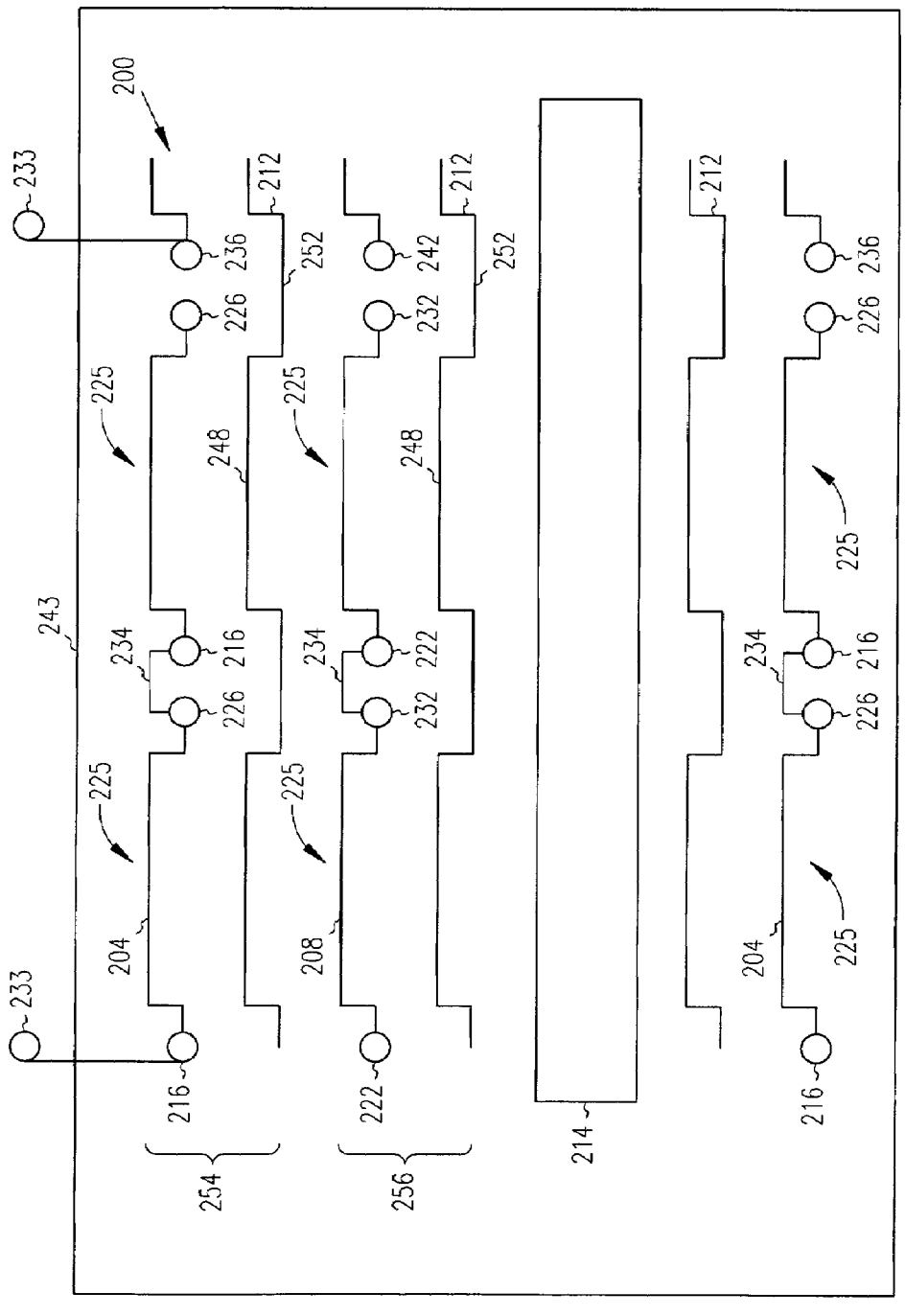

FIGS. 1 and 2 are top plan and side cut-away views, respectively, of an apparatus and circuit package according to various embodiments of the invention. Referring now to FIG. 1, it can be seen that the apparatus 100 according to an embodiment of the invention may include a first electrode 104 and a second electrode 108 located adjacent to a dielectric 112. The electrodes 104, 108 may be formed on top of, or underneath, the dielectric 112 and patterned so as to define a fractal geometry 113 thereon, or thereunder. Thus, the dielectric 112 may be formed on a substrate 114, prior to forming the electrodes 104, 108, or the dielectric 112 may also be formed over the electrodes 104, 108 after they are formed on the substrate 114.

The electrodes 104, 108 may be electrically coupled to one or more primary terminals 116, 122, respectively, which may in turn be coupled, respectively, to the positive and negative terminals of a power supply (not shown in FIG. 1, but illustrated in FIG. 3), for example. Of course, the primary terminals 116, 122 may also be respectively coupled to the negative and positive terminals of such a supply, if desired.

The fractal geometry 113 may take any number of forms. However, generally, the fractal geometry described herein refers to any self-repeating pattern of diminishing size. As is known to those of ordinary skill in the art, to produce a fractal geometry, each line segment of an initiator (e.g., a square) may be replaced with a generator curve (e.g. a serpentine segmented S-shape). Each segment of the resulting curve is thereafter recursively replaced with the generator, forming the fractal geometry. Ideal fractals have a finite area and an infinite perimeter. Therefore, the fractal geometry discussed herein may be governed by the following equation:

$$P = k(A)^{0.5D}/L^{(D-1)} \qquad \text{Equation (1)}$$

where P is the length of the perimeter of the geometry (e.g., the length of one or the other of the electrodes 104, 108 formed on, under, or residing within any one of the bounded areas $A_1$, $A_2$, $A_3$, or $A_4$), k is a fractal initiator proportionality constant that depends on the geometry of the initiator (e.g., for a square initiator geometry, k=4, whereas for an equilateral triangle initiator geometry, $k=2^{*4}\sqrt{27}$), and A is the total area of the initiator geometry. D is the fractal dimension (a ratio that has a value of between one and two, and is in accordance with the complexity of the fractal curve—curves having a higher degrees of D fill out a two-dimensional surface more efficiently), and may be defined by the following equation:

$$D = \log(N)/\log(1/\tau), \qquad \text{Equation (2)}$$

where N is the number of segments in the generator, and $\tau$ is the ratio of the generator segment size to the initiator segment size). L is the minimum technology feature size. Thus, as L→0 (i.e., tends toward zero), the length of the perimeter P of the geometry tends toward infinity (i.e., P→∞). More details concerning the fundamentals of individual fractal capacitors can be found by referring to the article "Fractal Capacitors" by Hirad Samavati, et al., published in the Institute of Electrical and Electronic Engineering Journal of Solid-State Circuits, Vol. 33, No. 12, Dec. 1998.

Thus, it is easy to see that within two or more sub-die areas 124 on the substrate, one or more individual capacitors 125 may be formed, each being identical, or different, with respect to a number of features (e.g., the fractal dimension, D) that influence the resulting individual capacitance and series resistance. For example, considering the capacitors 125 formed in areas $A_1$ and $A_3$, each one may be formed using different material for each one of the electrodes 104, 108, as well as the dielectric 112. Further, each capacitor 125 may be formed using different values for k, A, D, and even L. Preferred ranges for k may include, but not be limited to: about 2 to about 4. Preferred ranges for D may include, but not be limited to: about 1.5 to about 1.8. Preferred ranges for L may include, but not be limited to: about 0.12 to about 0.50 micrometers.

Suitable conductive materials for use as electrodes 104 and 108 include, but are not limited to: gold, silver, titanium, copper, aluminum, titanium nitride, tantalum nitride, doped polysilicon, and/or a combination of alloys. Electrodes 104, 108 may be formed on the substrate 114 and/or dielectric 112 using many techniques, including, but not limited to: physical vapor deposition (with or without plasma), chemical vapor deposition (thermal or plasma), electroplating, and/or atomic layer deposition. Suitable dielectric materials include, but are not limited to: tantalum pentoxide, aluminum oxide, hafnium oxide, silicon oxynitride, plasma enhanced nitride, barium strontium titanate, strontium titanate, lead zirconate titanate/lead lanthanum zirconate titanate, and many other relaxor type materials.

As is apparent from viewing FIG. 1, any number of capacitors 125 can be formed within any number of sub-dies 124 on the substrate 114. The primary terminals 116, 122 may be connected internally to other terminals 126, 132, and/or electrodes 104, 108, or even to external package connections 133, such as those used in flip chip pin grid arrays or ball grid arrays. The terminals 116, 122, 126, 132 may be connected to each other, to the electrodes 104, 108, or to external package connections 133 using jumper connections 134 in the form of wire bonds, deposited conductive material, ball grid array attachments, etc. Secondary terminals 136, 142 may be used to couple some of the capacitors 125 within the sub-die areas 124 to other circuitry, including circuitry external to the circuit package 143, or circuitry 146 internal to the circuit package 143, such as to a wireless transceiver 146 or a processor 146. It should be noted that the circuit package 143 according to various embodiments of the invention includes one or more external package connections 133. It should also be noted that the circuit package 143 may include more than one substrate 114. Thus, the capacitors 125 and circuitry 146 may be included on the same substrate 114, or on separate substrates 114 within the same package 143.

A substrate 114 may be arbitrarily divided up into several sub-die areas 124, each including one or more capacitors 125. For example, the substrate 114 may have several pairs of electrodes 104, 108, each pair corresponding to one of nine 100 microFarad capacitors, nine 10 microFarad capacitors, nine 1.0 microFarad capacitors, and nine 0.1 microFarad capacitors; i.e., each electrode pair 104, 108 may provide a capacitance value substantially different from another capacitance value provided by another electrode pair 104, 108. Continuing with this example, a user may elect to employ one or more jumper connections 134 and/or one or more external package connections 133 to provide any capacitance value which varies from approximately 0.1 microFarads to approximately 999.9 microFarads for presentation at the terminals 116, 122.

Turning now to FIG. 2, it can be seen that any number of capacitors 225 may be stacked or located in a vertical Z direction, as well as in the lateral direction (shown as directions X and Y in FIG. 1). One or more capacitors 225 may be located on a first side 248 of the dielectric 212, and one or more capacitors 200 may be located on a second side 252 of the same dielectric 212 that forms part of the apparatus. Further, although not shown in FIG. 2, one or more of the capacitors 225 may also be formed on the underside of the substrate 214, instead of on the top side (as shown in FIG. 2), if desired.

Any number of terminals 216, 222, 226, 232, 236, and 242, along with any number of external package connections 233 and jumper connections 234 may also be formed to connect the capacitors 225 in various configurations, as may be convenient to a user of the apparatus 200 and circuit package 243. Interconnection techniques which may be used to couple the capacitors 225 to each other and to other circuitry located on the various layers 254, 256 are well known to those of ordinary skill in the art. Each layer 254, 256 may include a unique dielectric 212, or a single dielectric 212 may be shared between capacitor electrodes 204, 208 located on different layers 254, 256.

Figure 3:
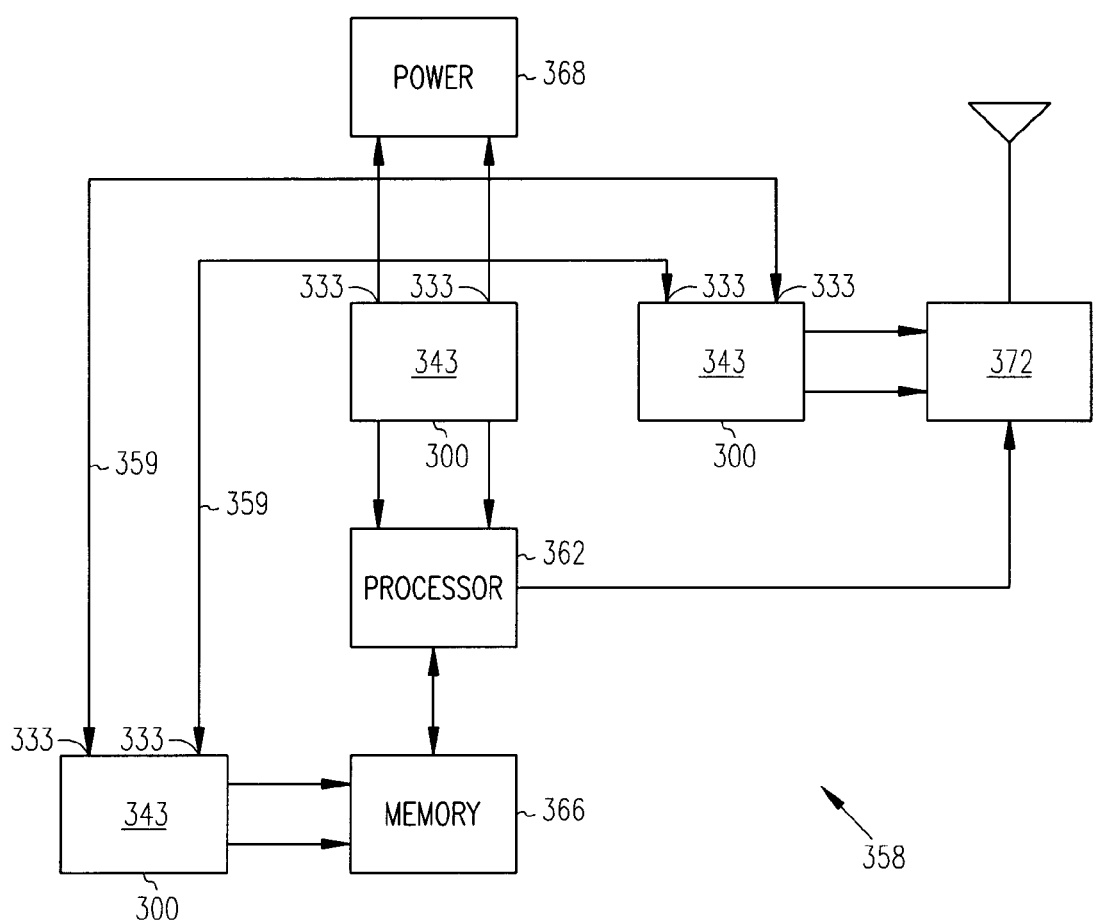
FIG. 3 is a schematic block diagram of a circuit package and a system according to various embodiments of the invention.

FIG. 3 is a schematic block diagram of a circuit package 343 and a system 358 according to various embodiments of the invention. The circuit package 343, which typically includes at least one of the apparatus (see elements 100 and 200 of FIGS. 1 and 2) described above, according to various embodiments of the invention, can be coupled to various elements of the system 358 using one or more of the included external package connections 333. For example, the system 358 according to an embodiment of the invention may include one or more circuit packages 343 (similar to or identical to the circuit packages 143, 243 illustrated in FIGS. 1 and 2), coupled to a processor 362, a memory 366, a power source 368 (e.g. a battery or power supply), and a wireless transceiver 372, using one or more power supply traces 359.

When the system 358 is designed, a user may select the apparatus 300 to include any number of sub-die areas, each including one or more fractal geometry capacitors, as described in detail above. Capacitance values provided within each sub-die area may be identical or similar to those provided in other sub-die areas, or substantially different from those provided in other sub-die areas, also as described in detail above. The dielectric used within each sub-die area may be the same, or different, and may include any number of dielectric materials such as those described previously, including various relaxor materials.

It should be noted that the system 358 may be characterized as a "module" herein. Such modules may include hardware circuitry, such as a microprocessor and/or memory circuits, software program modules, and/or firmware, and combinations thereof, as directed by the architect of the apparatus 100, 200, 300 and the system 358, and appropriate for particular implementations of various embodiments of the invention.

One of ordinary skill in the art will understand that the apparatus, circuit packages, and systems of various embodiments of the invention can be used in applications other than those involving processors and wireless transceivers, and thus, the invention is not to be so limited. The illustrations of an apparatus 100, 200, 300, a circuit package 143, 243, 343, and a system 358 are intended to provide a general understanding of the structure of various embodiments of the invention, and are not intended to serve as a complete description of all the elements and features of apparatus, circuit packages, and systems which might make use of the structures described herein.

Applications which may include the novel apparatus, circuit packages, and systems of various embodiments of the invention include electronic circuitry used in high-speed computers, communications and signal processing circuitry, processor modules, embedded processors, and application-specific modules, including multilayer, multi-chip modules. Such apparatus, circuit packages, and systems may further be included as sub-components within a variety of electronic systems, such as televisions, video cameras, cellular telephones, personal computers, radios, vehicles, and others.

Figure 4:
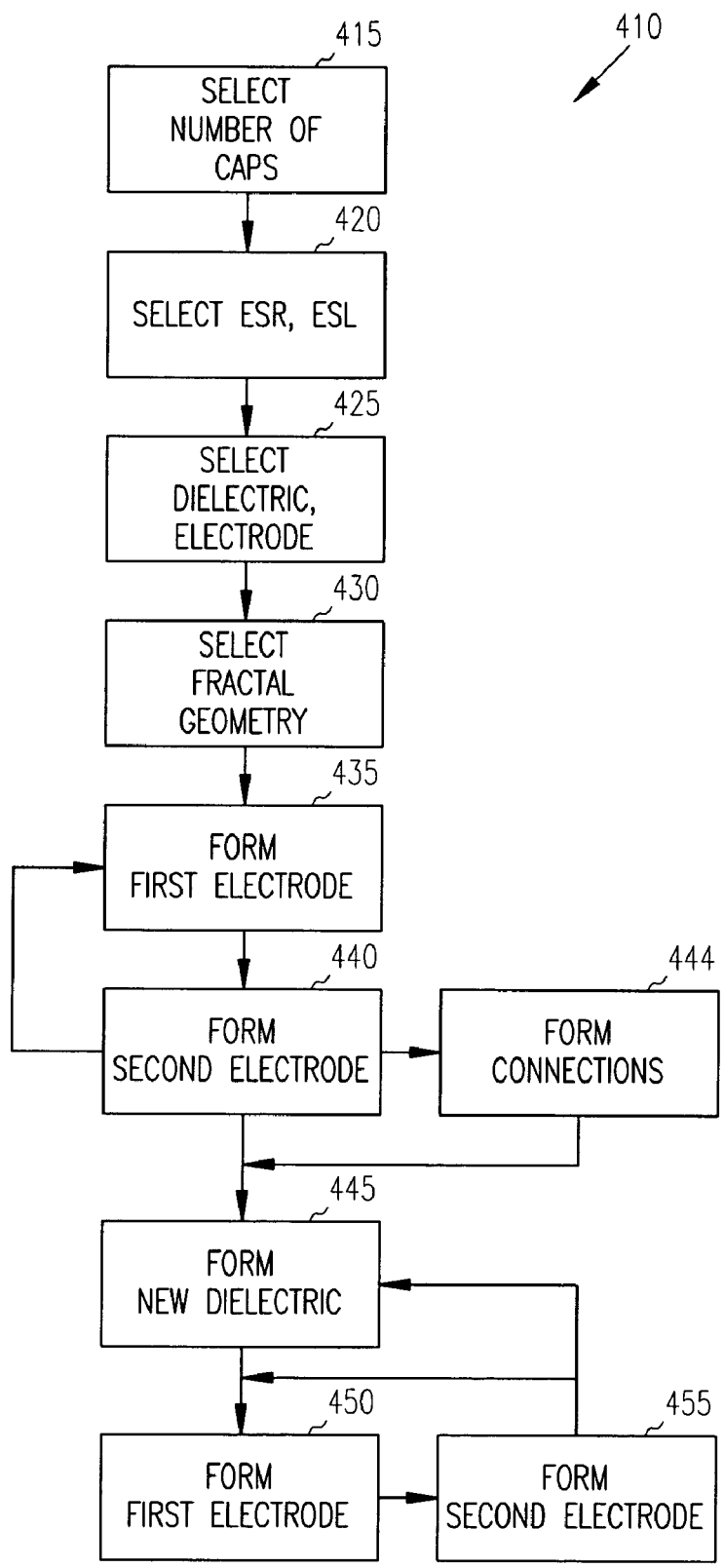
FIG. 4 is a flow chart illustrating a method of fabricating an apparatus according to an embodiment of the invention.

FIG. 4 is a flow chart illustrating a method of fabricating an apparatus according to an embodiment of the invention. The method 410 may include selecting a number of capacitors (and associated capacitance values and/or densities) at block 415. The method may continue with selecting a desired equivalent series resistance (ESR) and/or equivalent series inductance (ISL) value for each one of the capacitors at block 420. The method 410 may also include selecting one or more dielectric layers at block 425, including various dielectric characteristics, as well as the number, type, and composition of the electrodes which will define each capacitor on the dielectric layer(s).

The method may continue at block 430 with selecting one or more fractal geometries to be used in conjunction with each of the capacitors selected. The capacitance density for the individual capacitor selected previously may have a direct impact on the fractal geometry which is ultimately chosen.

At block 435, the first electrode may be formed on or under the dielectric layer (perhaps directly onto a substrate), substantially coincident with, or prior to, forming the second electrode. Forming the first and second electrodes onto or under the dielectric layer will then result in defining the fractal geometry for some or all of the capacitors selected to be included in the apparatus. Other pairs of first and second electrodes may be repeatedly formed on the dielectric layer at blocks 435 and 440. At block 444, one or more connections may also be formed on the dielectric layer (and even between dielectric layers and through an associated substrate) to connect two or more of the electrodes formed at blocks 435 and 440.

Another dielectric layer may be formed at block 445, either on top of the first and second electrodes, or on the underside of the substrate. Then, subsequent first and second electrodes may be formed onto the new dielectric layer, either substantially simultaneously, or in a substantially serial fashion. Of course, as noted above, the first dielectric layer may be shared between pairs of electrodes, so that multiple electrode pairs may be formed on one or both sides of the same dielectric, perhaps with each pair located within a uniquely assigned sub-die area. Each pair of electrodes defines a fractal geometry, which may be the same or substantially similar from sub-die area to sub-die area, or which may be different. Then, at blocks 450 and 455, a new pair of first and second electrodes may be formed on the second dielectric. Blocks 450 and 455 may be repeated to form further electrode pairs on the second dielectric layer. Similarly, blocks 445, 450, and 455 may also be repeated to form subsequent dielectric layers and pairs of electrodes according to various embodiments of the invention.

The apparatus, circuit packages, systems, and methods of various embodiments of the invention may provide a mechanism whereby the capacitance available to users can be widely varied even though a standard product is purchased. Correct amounts of ESR and ESL for each stage in a particular circuit may be selected simply by judicious configuration of circuit packages designed according to various embodiments of the invention, for example. This may be especially important in areas where high values of capacitance, associated with low values of ESR, are needed, such as may be desirable for use with power planes of a computer mother board.

Although specific embodiments have been illustrated and described herein, those of ordinary skill in the art will appreciate that any arrangement which is calculated to achieve the same purpose may be substituted for the specific embodiments shown. This disclosure is intended to cover any and all adaptations or variations of the invention. It is to be understood that the above description has been made in an illustrative fashion, and not a restrictive one. Combinations of the above embodiments, and other embodiments not specifically described herein will be apparent to those of skill in the art upon reviewing the above description. The scope of embodiments of the invention includes any other applications in which the above structures and methods are used. The scope of embodiments of the invention should be determined with reference to the appended claims, along with the full range of equivalents to which such claims are entitled.

It is emphasized that the Abstract is provided to comply with 37 C.F.R. §1.72(b) requiring an Abstract that will allow the reader to quickly ascertain the nature of the technical disclosure. It is submitted with the understanding that it will not be used to interpret or limit the scope or meaning of the claims. In the foregoing Detailed Description of Embodiments of the Invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description of Embodiments of the Invention, with each claim standing on its own as a separate preferred embodiment.

What is claimed is:

1. An apparatus, comprising:
a first electrode and a second electrode defining a first fractal geometry;
a third and a fourth electrode defining a second fractal geometry; and
a first dielectric adjacent the first and third electrodes.

2. The apparatus of claim 1, wherein the first fractal geometry has a different fractal dimension than the second fractal geometry.

3. The apparatus of claim 1, wherein the first electrode is bounded by a first area, wherein the third electrode is bounded by a third area, and wherein the first and third areas are different.

4. The apparatus of claim 1, wherein the first and second electrodes are included in a first sub-die area of the first dielectric, and wherein the third and fourth electrodes are included in a second sub-die area of the first dielectric.

5. The apparatus of claim 1, wherein the first and second electrodes are located on a first side of the first dielectric, and wherein the second and fourth electrodes are located on a second side of the first dielectric.

6. The apparatus of claim 5, further comprising:
a fifth electrode and a sixth electrode including the first fractal geometry;
a seventh electrode and an eighth electrode including the second fractal geometry; and
a second dielectric adjacent the fifth and seventh electrodes.

7. The apparatus of claim 1, wherein the first and second electrodes provide a first capacitance value substantially different from a second capacitance value provided by the third and fourth electrodes.

8. The apparatus of claim 7, wherein the first capacitance value is approximately 100 microfarads, and wherein the second capacitance value is approximately 0.1 microfarads.

9. The apparatus of claim 1, wherein the first fractal geometry is defined by an equation of the form $P=k(A)^{0.5D}/1^{(D-1)}$, and wherein P is a length of a perimeter of the first fractal geometry, k is a fractal initiator proportionality constant, A is a total area of an initiator geometry, D is a fractal dimension, and 1 is a minimum technology feature size.

10. The apparatus of claim 1, wherein the first and second electrodes comprise a first metal, and wherein the third and fourth electrodes comprise a second metal.

11. A circuit package, comprising:
an apparatus including a first electrode and a second electrode defining a first fractal geometry, a third and a fourth electrode defining a second fractal geometry, and a first dielectric adjacent the first and third electrodes;
a first external package connection connected to the first electrode; and
a second external package connection connected to the second electrode.

12. The circuit package of claim 11, further comprising:
a first connection capable of connecting the first and third electrodes; and
a second connection capable of connecting the first and third electrodes.

13. The circuit package of claim 12, further comprising:
a fifth electrode and a sixth electrode including the first fractal geometry;
a third connection capable of connecting the first and fifth electrodes; and
a fourth connection capable of connecting the second and sixth electrodes.

14. The circuit package of claim 11, wherein the first and second fractal geometries are different.

15. An apparatus, comprising:
a first electrode and a second electrode defining a first fractal geometry;
a third and a fourth electrode defining a second fractal geometry; and
a first dielectric adjacent the first and third electrodes, wherein the first and second electrodes are located on a first side of the first dielectric, wherein the second and fourth electrodes are located on a second side of the first dielectric, and wherein the first and second electrodes provide a first capacitance value substantially different from a second capacitance value provided by the third and fourth electrodes.

16. The apparatus of claim 15, wherein the first fractal geometry has a different fractal dimension than the second fractal geometry.

17. The apparatus of claim 15, wherein the first electrode is bounded by a first area, wherein the third electrode is bounded by a third area, and wherein the first and third areas are different.

18. The apparatus of claim 15, wherein the first fractal geometry is defined by an equation of the form $P=k(A)^{0.5D}/1^{(D-1)}$, and wherein P is a length of a perimeter of the first fractal geometry, k is a fractal initiator proportionality constant, A is a total area of an initiator geometry, D is a fractal dimension, and 1 is a minimum technology feature size.

* * * * *